US005101318A

United States Patent [19]

Fife

[11] Patent Number: 5,101,318

[45] Date of Patent: Mar. 31, 1992

[54] CONNECTOR AND METHOD AND APPARATUS FOR MAKING

[75] Inventor: Robert M. Fife, Attleboro, Mass.

[73] Assignee: Texas Instruments Incorporated, Dallas, Tex.

[21] Appl. No.: 579,013

[22] Filed: Sep. 7, 1990

[51] Int. Cl.[5] .......................... H01G 1/14; H05K 1/18

[52] U.S. Cl. ...................................... 361/306; 174/250

[58] Field of Search .................... 228/19, 20; 219/227, 219/229, 230; 361/539, 540, 306; 29/743

[56] References Cited

U.S. PATENT DOCUMENTS

| | | | |
|---|---|---|---|
| 3,619,478 | 11/1971 | Staiger | 174/68.5 |
| 3,870,843 | 3/1975 | Witte | 200/302 |
| 4,328,406 | 5/1982 | Evans | 200/293 |
| 4,518,110 | 5/1985 | Breske et al. | 228/20 |

*Primary Examiner*—Donald A. Griffin
*Attorney, Agent, or Firm*—James P. McAndrews; John A. Haug; Melvin Sharp

[57] ABSTRACT

A connector for mounting an i.c. unit on a circuit board is made by providing an electrically insulating, thermoplastic body with a plurality of apertures arranged in a pattern and with contact members disposed in the apertures so that terminal portions of the members extend from the apertures at one side of the body. A heated tool having hollow cylindrical portions spaced in the same pattern at one side of the tool is advanced to accommodate the extending terminal portions of the contact members in the hollow portions of the tool and to engage ends of the hollow cylindrical tool portions with individual parts of the body surrounding the respective apertures. The heated tool portions are held in engagement with the thermoplastic body for a selected dwell time to heat limited portions of the body material abutting the apertures to a glass transition temperature of the body material less than the material melting temperature; are then pressed against the body to penetrate the heated body material portions to displace heated material into the individual apertures against the contact members; and are then withdrawn to permit the displaced material to cool to secure and preferably to seal the contact members in selected positions in the body apertures.

25 Claims, 3 Drawing Sheets

CONNECTOR AND METHOD AND APPARATUS FOR MAKING

BACKGROUND OF THE INVENTION

The field of the invention is that of electrical devices having electrically conductive members secured in selected position in a thermoplastic body and relates more particularly to electrical connectors having contact members mounted in an electrically insulating body for use in mounting integrated circuit units on a circuit board.

Conventional connector products used for detachably mounting integrated circuit units on a printed circuit board or panel comprise a molded body of an electrically-insulating, thermoplastic material having rows of body apertures extending through the body. Electrically conductive metal contact members are disposed in the respective apertures to receive and resiliently engage terminals from the i.c. unit which are inserted into the body apertures from one side of the body. Terminal portions of the contact members extend from the apertures at the opposite sides of the connector body to be received in mounting holes in a printed circuit board and to be soldered to circuit pads on the circuit board. In that arrangement, i.c. terminals are detachably engaged by the connector contact members to be connected in the circuit on the circuit board and are easily and safely assembled in the circuit or removed for replacement if desired.

Typically the electrically conductive metal contact members have barbs which are pressed into the connector body materials in the body apertures for securing the contact members in the body. Typically various means are also used to prevent wicking of the solder or solder flux materials or the like into the resilient portions of the contact members through the body apertures during soldering of the contact members to circuit paths on a circuit board. Frequently however the securing of the contact members in the apertures can cause damage to the contact members or can result in contact members or portions of the connector body being subjected to excessive stress, particularly where a large number of connector members are to be mounted in the connector at the same time so that substantial force is required for forcing the contact members into the body apertures. It would be desirable if the connector body and contact members were free of excessive stresses and could be manufactured in a convenient and inexpensive manner to have the contact members disposed in selected positions in the body apertures without requiring additional means for preventing wicking into the connector body apertures.

BRIEF SUMMARY OF THE INVENTION

It is an object of the invention to provide a novel and improved electrical device having an electrically conductive member secured in a selected position in the body with a portion of the member extending from the body; to provide a connector device having electrically conductive contact members secured and preferably sealed in connector body apertures to extend from the apertures substantially free of excessive stress in the contact members and/or body materials; to provide novel and improved methods for making such electrical devices; to provide novel and improved apparatus for making such electrical devices; and to provide such methods and apparatus which are convenient and economical to use in providing integrated circuit connectors or sockets of high quality at low cost.

Briefly described, the novel and improved electrical device of the invention comprises a connector for use in detachably mounting an i.c. unit on a printed circuit board for electrically connecting terminals of the unit to circuit paths on the board. The connector includes a molded body of electrically-insulating, thermoplastic material such as glass-filled nylon or the like having a pattern of molded-in apertures extending through the body. The connector also has a plurality of electrically conductive, metal, contact members disposed in the respective apertures to detachably engage i.c. unit terminals inserted into the apertures at one side of the connector body. Terminal portions of the contact members extend from the apertures at the opposite side of the body to be received in mounting holes in a circuit board to connect the contact members in the board circuit. The contact members are secured and preferably sealed in the apertures substantially free of excessive stresses in the contact members or connector body by selected portions of the body material which are displaced from the body into the respective body apertures against the contact members in the apertures while those body material portions are heated to a glass transition temperature of the material less than the melting temperature of the material. The displaced portions of the body material are cooled in situ in the body apertures. Preferably the contact members have reentrant surface portions and the displaced body material portions fit into those reentrant surface portions of the members to lock the contact members in the connector body.

In accordance with the methods and apparatus of the invention the electrically conductive metal contact members are disposed in molded-in apertures in the thermoplastic connector body with a selected clearance to the body in the apertures. A heated tool provided with a plurality of heated hollow cylindrical portions arranged in spaced side-by-side relation to each other is advanced into engagement with the connector body so that the extending portions of the contact member terminals are accommodated in the respective hollow cylindrical portions of the tool and so that the ends of the hollow cylindrical portions of the tool are applied to the connector body surrounding each of the body apertures. The heated tool is retained in that engagement with the connector body for a selected dwell time to heat portions of the body material abutting each aperture to a selected glass transition temperature of the body material without heating those portions of the body to the melting temperature of the body material. The heated tool is then advanced further to press the heated tool end portions into the heated body material portions, thereby to penetrate and displace the heated body material portions into the respective apertures against the contact members in the apertures. The heated tool is then withdrawn for permitting the displaced body material portions to cool in situ for securing and preferably sealing the contact members in the selected positions in the body apertures free of excessive stress in the contact members or body materials. In that way the improved electrical device of the invention is conveniently and economically manufactured with high quality at low cost.

DESCRIPTION OF THE DRAWINGS

Other objects, advantages and details of the novel and improved connector devices and the like and methods and apparatus of the invention appear in the following detailed description of preferred embodiments of the invention, the detailed description referring to the drawings in which.

DESCRIPTION OF THE PREFERRED EMBODIMENTS

Figure 1:
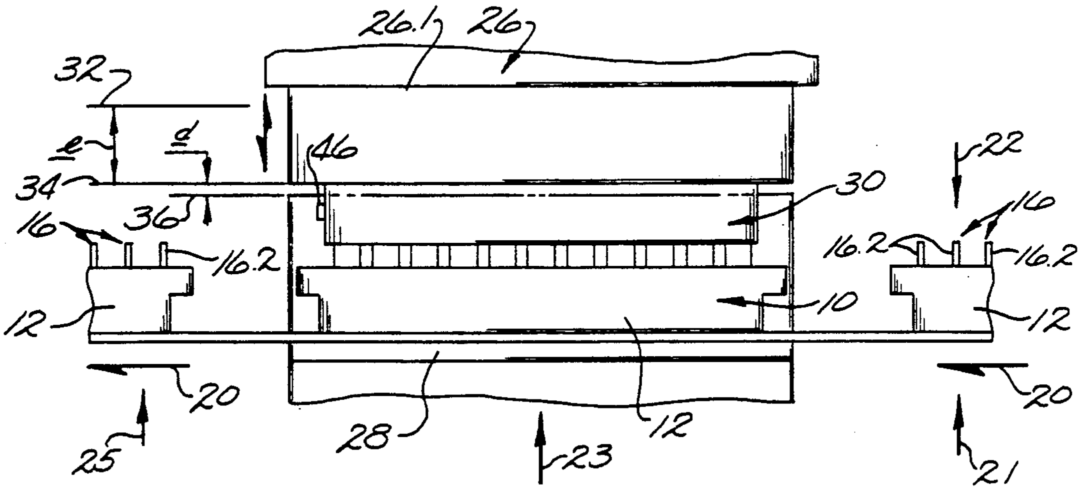
FIG. 1 is a front elevation view of the novel apparatus of the invention diagrammatically illustrating the novel method for making the novel device of the invention.

Referring to the drawings, 10 in FIGS. 1–4 indicates the novel and improved electrical device of the invention. In one preferred embodiment, the device comprises a mating connector as shown or the device could comprise a socket for use in mounting an i.c. unit on a printed circuit board or the like, the device including a connector body 12 of electrically insulating thermoplastic material having a plurality of apertures 14 formed in the body in a selected pattern. For example, the apertures are arranged in a plurality of side-by-side rows (only one being shown) and preferably extend through the body. Preferably for example, the connector body is molded of a rigid glass-filled nylon or polyphenylene sulfide or the like in any conventional manner and preferably the apertures 14 are formed in the body by molding so that as initially formed the body material is in a substantially stress-free as-molded condition.

A plurality of electrically conductive metal contact members 16 or the like are disposed in selected positions in the respective apertures so that first ends 16.1 of the members are disposed at one side of the connector body to receive and to resiliently and detachably engage i.c. unit terminals inserted into the apertures at that side of the body and so that terminal portions 16.2 of the contact members extend from the respective apertures at an opposite side of the body in generally parallel relation to each other to be mounted in circuit board holes and connected to circuit paths on the board as will be understood. Preferably the contact members are of a generally conventional, high performance type comprising post components 16.3 formed as screw machine parts of brass or the like having bores 16.4 therein holding spring clips 16.5 to resiliently and detachably engage mating contact or i.c. unit terminals or the like in known manner. However, other metal members adapted to be mounted in a thermoplastic body are also within the scope of the invention. In a preferred embodiment, the post components have reduced diameter portions 16.6 providing the posts with reentrant surface portions 16.7.

The thermoplastic body 12, preferably in as-molded condition or as formed by machining or other procedure as desired, is located on a conveyor belt means 18 or the like to be advanced intermittently or the like as diagrammatically indicated by arrows 20 in FIG. 1 from a first station indicated at 21 in FIG. 1, to a second station indicated at 23, and then to a third station indicated at 25. The contact members are preferably inserted into the body apertures at the first station in any conventional manner as is diagrammatically illustrated by the arrow 22 in FIG. 2. In the invention, the contact members are preferably inserted into the apertures with a selected clearance as diagrammatically shown in FIG. 2 to facilitate insertion of the contact members into the apertures. In that regard, the contact members are accommodated in the apertures quite closely or even snugly and the clearance is very small but is sufficient such that the contact members are inserted in the selected position without requiring contact insertion forces such as might cause damage to the contact members or connector body or result in the contact members being held in the body under stress or with stresses in the body such as might result in warpage of the connector body or misalignment of contact members in the body. This is particularly significant where a large number of the contact members are connected together by carrier strip means or the like or are otherwise inserted into a connector body at the same time so that, if barbs or the like had to be forced into the rigid body material, substantial contact insertion forces would be required. If desired, the conveyor means 18 include guide and/or support means 24 or the like to facilitate locating the connector bodies on the conveyor and, if desired, of the contact members in the selected positions in the connector body apertures.

Figure 2:
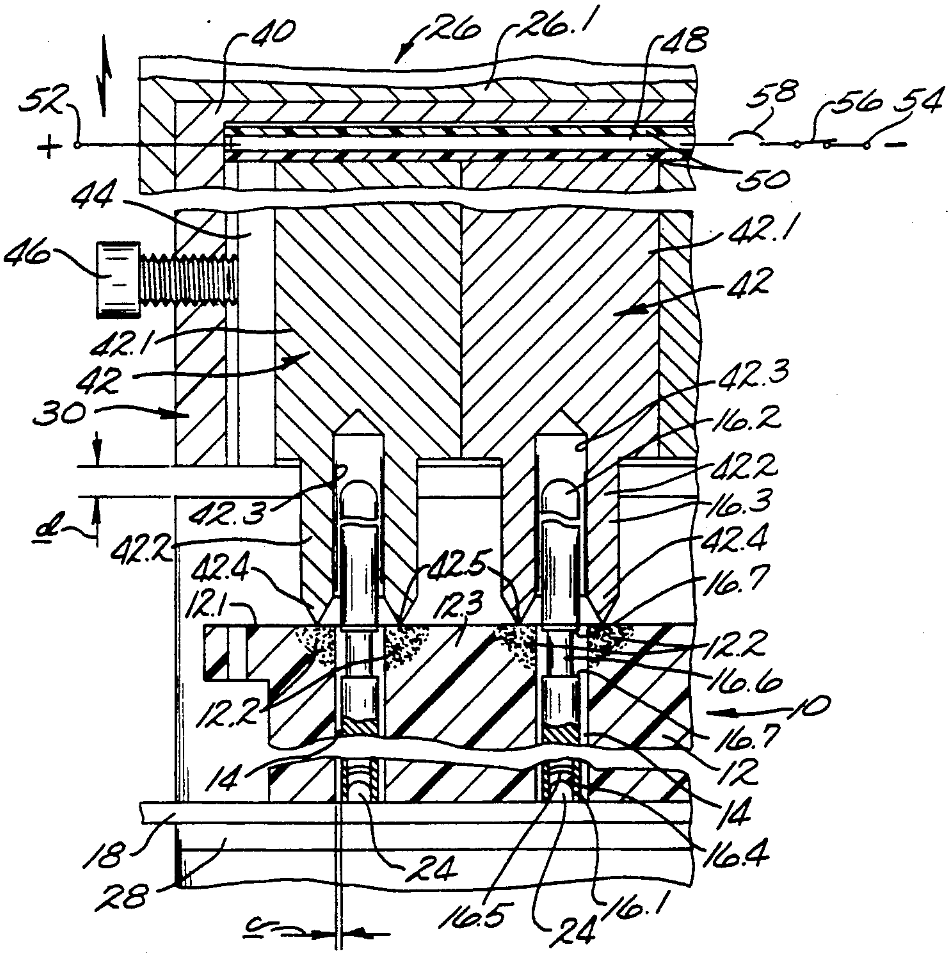
FIG. 2 is a partial section view to enlarged scale similar to FIG. 1 along a vertical axis of the apparatus shown in FIG. 1 illustrating a step in the method of the invention.
Figure 3:
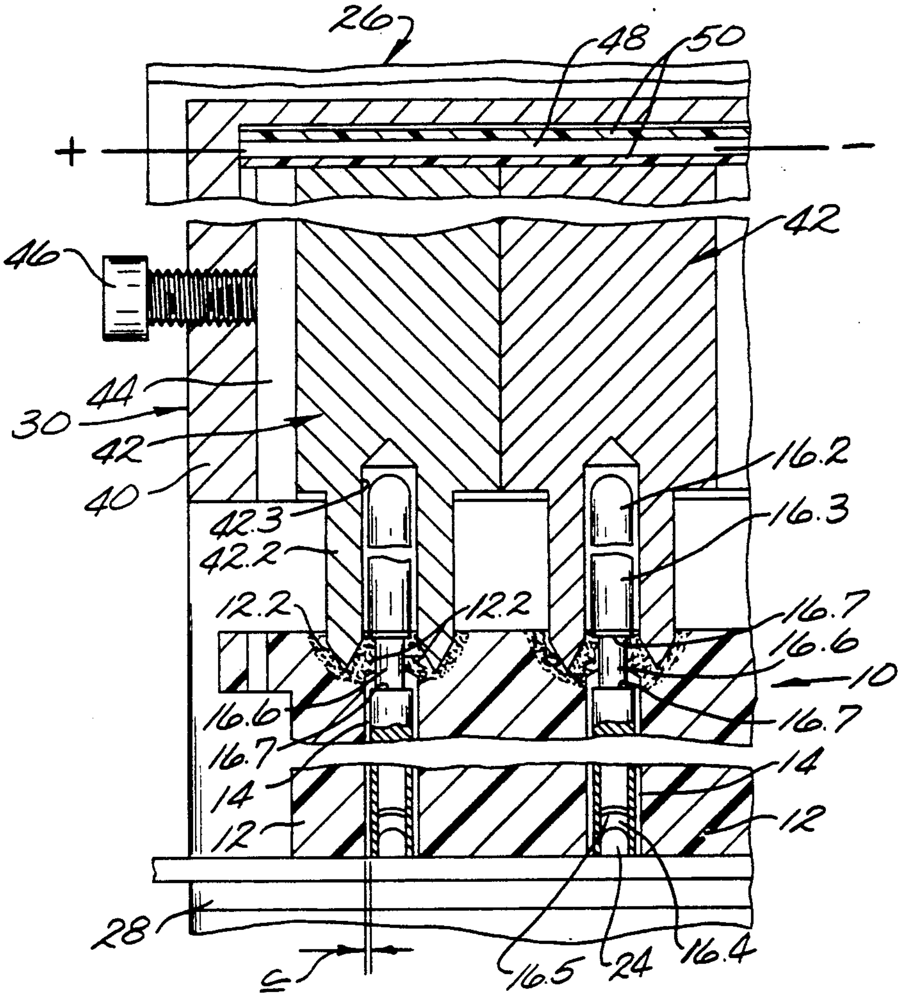
FIG. 3 is a partial section view similar to FIG. 2 illustrating a subsequent step in the method of the invention.

A generally conventional press apparatus 26 is preferably located to receive the connector body with the contact members therein at the second station as indicated at 12 in FIGS. 1-3. The press apparatus preferably includes a support table 28 or the like for the connector body and mounts a heated tool 30 over the support so that the tool is adapted to move intermittently between three positions indicated by the guidelines 32, 34 and 36 respectively in FIG. 1. That is, the press apparatus is of any conventional type adapted to lift the heated tool 30 to the level indicated by guideline 32 to permit the conveyor 18 to move the connector body with its inserted contact members into the second station on the press support table. The press apparatus is then adapted to advance the heated tool downward to the level indicated by guideline 34 for engaging the tool with the connector body as described below. The press apparatus is then adapted to advance or press the tool down to the third level 36 as is also discussed below. In that latter movement, the upper or pressing or actuating portion 26.1 of the press apparatus preferably moves a selected distance d and then engages a stop 38 to limit the downward advance of the tool. If desired, comparable stop means (not shown) are provided for limiting downward movement of the tool a selected distance when initially applying the tool to the connector body. As will be understood, the press is adapted to return the tool to the first level 32 to permit the conveyor to move the connector body to the third station 25 and to permit feeding of a new body from the first station.

In accordance with the invention, the heated tool comprises a plurality of tool portions which are adapted to be applied to a surface 12.1 of the connector body adjacent to each connector body aperture for heating a selected limited portion of the connector body material abutting the aperture to a selected glass transition temperature of the thermoplastic material. In the preferred embodiment of the invention as shown in FIGS. 2-3 for example, the heated tool comprises a frame 40 having a plurality of hollow cylindrical portions arranged in a selected pattern along one side of the tool. Preferably for example, a plurality of tool components 42 each of a rectangular or square configuration at one end as indicated at 42.1 are machined or otherwise formed at their opposite ends 42.2 to be hollow as shown at 42.3 and to be cylindrical for a selected portion of their length. Preferably the tips 42.4 of the hollow cylindrical portions have a generally pointed configuration with a small radius provided at the end edge 42.5 of the tip. A clamp 44 adjustably connected to the frame 40 by screw means 46 or the like clamps the two components together at their rectangular end portions 42.1 for disposing the hollow cylindrical end portions 42.2 of the tool in spaced relation to each in a selected pattern. Of course, tool components of various other configurations are incorporated in or made integral in the heated tool to provide the spaced end portions 42.2 of the tool in any desired pattern within the scope of the invention.

The tool also includes a heater of any conventional type for heating the spaced end portions of the tool to a desired temperature. Preferably for example, a heater strip 48 of electrical resistance material is mounted over the ends 42.1 of the tool components and is electrically insulated from the frame from the tool components by thin strips 50 of electrical insulating material so that the heater strip is in close heat-transfer relation to the tcol components for heating the ends 42.4 of the tool components to a desired temperature. The heater strip is connected to a power source as indicated by the line terminal 51, 54 and the switch 56 and preferably a thermostat 58 of any conventional type is arranged to control operation of the heater to regulate the temperature of the ends 42.2 of the tool at the desired level.

In using the apparatus just described for making connectors or other electrical devices 10 as described, the press apparatus 26 advances the heated tool in the direction of the connector body to the level 34 so that the extending portions 16.2 of the contact members in the body apertures are accommodated in the respective hollow portions of the heated tube and so that the tips of the hollow cylindrical tool portions 42.2 are applied to parts of the body at the body surface 12.1 surrounding the respective body apertures. The press apparatus is adapted in any conventional way to retain the tool in engagement with those parts of the body for a selected dwell time to heat selected limited portions of the body material to a selected glass transition temperature of the body material less than the melting temperature of the body material as indicated by the stippling of 12.2 in FIGS. 2-4. That is, the heated tool is held in the position shown in FIG. 2 until the thermoplastic body material is no longer rigid in the limited portion of the body material abutting the respective apertures but becomes easily deformable. Preferably the heating is regulated so that portions of the body between the heated body portions 12.2 as indicated at 12.3 remain relatively rigid. Preferably for example, where the body material comprises polyphenylene sulfide having a melting temperature on the order of 560° to 600° C. the tool is retained in the position shown in FIG. 2 until the limited portions 12.2 of the body material are heated to a glass transition temperature in the range from about 465° to 525° C., and preferably to 485° C., the tool itself typically being heated to a relatively higher temperature for accomplishing the desired heating of the body portion 12.2 within a few seconds. Typically for example, the heated tool is applied in the position shown in FIG. 2 for about 5 seconds.

The heated tool is then advanced further in the same direction to the level 36 so that the ends 42.2 of the heated hollow cylindrical tool portions penetrate into the connector body at the heated body portions 12.2 as shown in FIG. 3 and displace the heated body portions 12.2 into the respective body apertures 14 against the contact member 16 within the apertures. Preferably the displaced body material engages the contact member in each aperture entirely around the aperture for sealing the aperture and preferably the displaced body material portions are received within the reentrant surface portions 16.7 of the positions in the apertures.

Figure 4:
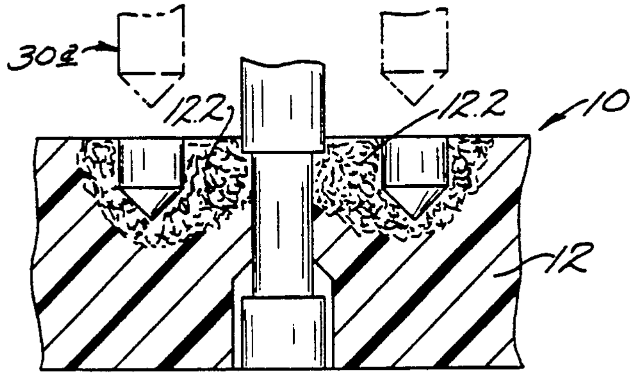
FIG. 4 is a partial section view similar to FIG. 3 illustrates a subsequent step in the method of the invention.

The heated tool 30 is then withdrawn in the opposite direction as indicated at 30*a* in FIG. 4, back to the level 32 for example, for permitting the heated thermoplastic body material portions to cool in situ as shown in FIG. 4 to lock the contact members 16 in selected position in the thermoplastic body. The conveyor means 18 moves the then finished device 10 to the third station as will be understood for finishing cooling of the body material portions.

In that way, the novel and improved electrical device 10 is provided with a molded thermoplastic body 12 holding conductive contact member 16 in selected position in a body aperture with selected limited portions of the body material cooled in situ against the contact members in the aperture without significant stress in the body materials either as displaced or as-molded or in the contact members as secured in the body materials. Preferably the contact members are sealed in the body apertures to be free of wicking into the apertures during soldering of contact terminals portions to a printed circuit board. Preferably the material cooled in situ in the body is disposed in reentrant surface portions of the contact members so the contact members are securely locked in the body. The apparatus used in making the electrical devices 10 uses generally conventional or easily made components and the methods for making the devices are simple and convenient to carry out while producing high performance products at low cost.

Figure 5:
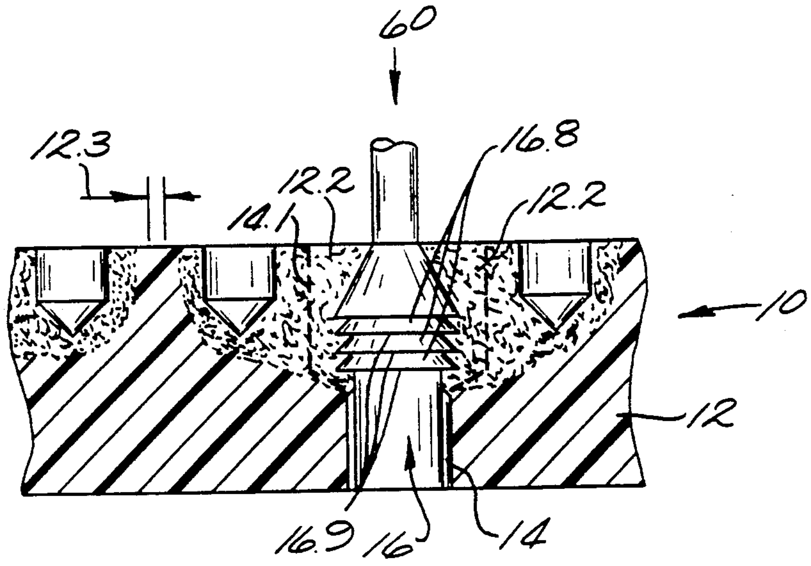
FIG. 5 is a partial section view similar to FIG. 4 illustrating another preferred embodiment of the invention.

In another preferred embodiment as shown in FIG. 5, wherein corresponding reference numerals refer to corresponding device components, the body apertures 14 include counterbores 14.1 and the contact members 16 have portions 16.8 of greater diameter forming a plurality of reentrant surface portions 16.9 preferably facing into the body aperture along the longitudinal axis of the contact members. The limited portions 12.2 of the body material which are displaced into the body aperture 14 being received against the contact members to be disposed in each of the plural reentrant surface portions 16.9 extending around the circumference of the contact members for securely locking and sealing the member in the body opening to resist forces applied to the contact member as indicated by the arrows 60 so that such forces are unlikely to dislodge the contact members.

Figure 6:
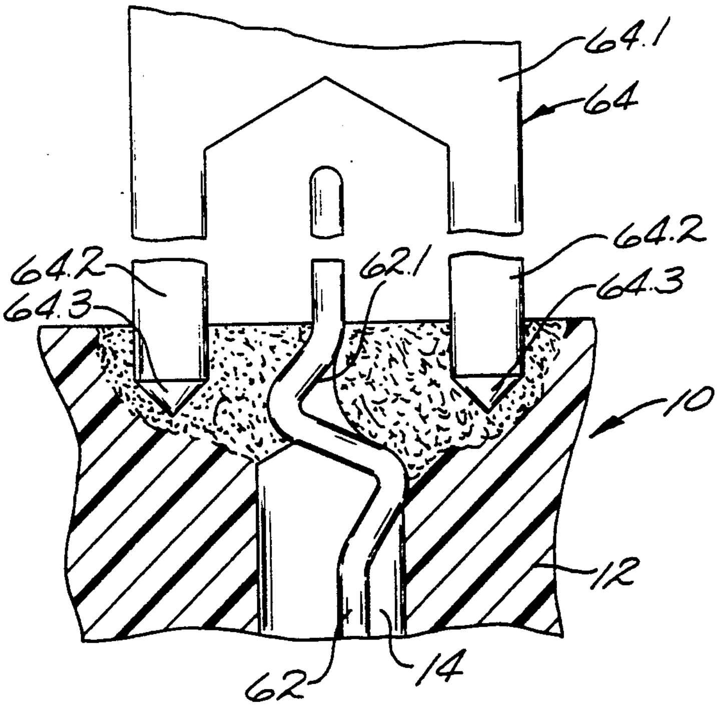
FIG. 6 is a partial section view similar to FIG. 5 illustrating another preferred embodiment of the invention.

In another preferred embodiment of the invention as shown in FIG. 6, wherein corresponding reference numerals also used, the contact member 62 comprises a wire member bent to provide it with a reentrant surface portion 62.1 or the like disposed within the aperture 14 in the body 12 and a heated tool 64 has one end portion 64.1 which is of thin flat shape and an opposite end 64.2 which is blanked from the flat shape to provide a pair of pointed, heated tool tip portions 64.3. The tool 64 is used in a manner corresponding to the tool 30 previously described to heat two selected limited portions 12.2 of the body material at opposite sides of body aperture to the selected glass transition temperature of the body material less than the melting temperature of the material. The tool is then advanced to penetrate the body material as shown in FIG. 6, to displace the heated body material portions into the apertures at respective opposite sides of the member 16 to bear against the opposite member sides and to be received in the reentrant surface portions of the contact member. The tool is then withdrawn as previously described for permitting the heated body material portions to cool and secure the contact member in the body aperture.

It should be understood that although particular embodiments of the invention are described by way of illustrating the invention, the invention includes all modifications and equivalents of the disclosed embodiments falling within the scope of the appended claims.

I claim:

1. A method for making a device having a metal member secured in selected position in a body of thermoplastic material comprising the steps of providing a body of thermoplastic material having an aperture in the body and having a metal member disposed in a selected position in the aperture, heating a selected limited portion of the body material around at least a part of the aperture to a temperature equal to a glass transition temperature of the material and less than a melting temperature of the material, thereafter pressing against the heated portion of the body material to displace material from the heated body portion into the aperture against the member locating the member in the selected position in the aperture, and cooling the heated body portion to secure the member in the selected position in the body of thermoplastic material.

2. A method for making an electrical device having an electrically conductive metal member secured in a selected position in a body of thermoplastic material to extend from the body comprising the steps of providing a body of rigid thermoplastic material having an aperture in the body and having an electrically conductive metal member disposed in a selected position in the aperture with selected clearance relative to the body in the aperture to extend from the aperture, applying a heated tool to a portion of the body adjacent the aperture for a selected period of time to heat a selected limited portion of the body material abutting the aperture to a selected temperature equal to a glass transition temperature of the body material and less than a melting temperature of the body material, thereafter pressing the tool against the heated body material portion with selected force to displace body material from the heated body portion into the aperture against the member locating the member in the selected position in the aperture, and cooling the heated body material portion to make the displaced body material rigid to secure the member in the selected position in the body of thermoplastic material.

3. A method according to claim 2 wherein the heated tool is applied to a part of the body surrounding the aperture on a surface of the body to heat the selected limited portion of the body material to the selected temperature at a location abutting the aperture entirely around the circumference of the aperture, and the extending portion of the member, and the tool is pressed against the part of the body surrounding the aperture to displace body material from the heated body portion into the aperture entirely around the member for sealing the aperture.

4. A method according to claim 3 wherein the heated tool is advanced in a selected direction into a position of engagement with said part of the body, is maintained in that position of engagement for a selected period of time to heat the selected limited portion of the body material to the selected temperature, is again advanced in said selected direction to penetrate the portion of the body material heated to the selected temperature to displace said body material into the aperture, and is withdrawn from penetration and engagement with the body by movement in an opposite direction for permitting the displaced body material to cool and become rigid.

5. A method for making an electrical connector device according to claim 4 wherein the body has a plurality of apertures having a plurality of members comprising connector contacts having terminal portions thereon disposed in selected positions in the respective apertures with selected clearance relative to the body in the respective apertures to extend the terminal portions from the respective apertures to form connector terminals, the heated tool is applied to a part of the body surrounding each aperture on the surface of the body to heat selected limited portions of the body material to the selected temperature at the same time at locations abutting the respective apertures around circumferences of the respective apertures, thereafter the tool is pressed against the parts of the body surrounding the respective apertures at the same time to displace body material from the heated body portions into the respective apertures against the members locating the members in selected positions in the respective apertures, and the heated body material portions are cooled and made rigid at the same time to secure the members in selected positions in the body.

6. A method according to claim 5 wherein the body is molded with the apertures having a selected spacing therebetween and the heated tool is applied to the parts of the body surrounding each aperture to heat the selected limited portions of the body material to said selected temperature in spaced relation to each other leaving body material on said surface in as-molded condition between each adjacent pair of apertures.

7. A method according to claim 6 wherein the member has a reentrant surface portion thereon, the member is inserted into the aperture to dispose the reentrant surface portion in the aperture, and the heated body material portions is displaced into the reentrant surface portion of the member in the aperture for locking the member in the aperture.

8. A method according to claim 6 wherein the member has a plurality of the reentrant surface portions thereon extending around the circumference of the member, and the heated body material portion is displaced into the plurality of the reentrant surface portions on the member.

9. A method according to claim 8 wherein the member has an axis extending along the length of the member extending from the body, and the reentrant surface portions of the member have surfaces disposed normal to the axis facing into the aperture to prevent axial forces applied to a distal end of the member toward the body from displacing the member in the body.

10. A method according to claim 9 wherein the aperture extends through the body and has a counterbore portion at said body surface of relatively larger size than the remainder of the aperture accommodating the displaced body material below the body surface.

11. A method according to claim 2 wherein the heated tool is applied to two parts of the body on a surface of the body adjacent respective opposite sides of the aperture to heat respective selected limited portions of the body material to the selected temperature at locations abutting the respective opposite sides of the aperture at the same time, thereafter the tool is pressed against the two parts of the body to displace body material from the respective heated body portions into respective opposite sides of the aperture against respective opposite sides of the member at the same time to locate the member in the selected position, and the heated body material portions are cooled and made rigid at the same time to secure the member in the selected position in the body.

12. Apparatus for making a device having a metal member secured in a selected position in a body of thermoplastic material comprising means for supporting a body of thermoplastic material having an aperture in the body and having a metal member disposed in a selected position in the aperture, means for heating a selected limited portion of the body material around at least part of the aperture to a temperature equal to a glass transition temperature of the material and less than a melting temperature of the material, means for thereafter pressing against the heated portion of the body material to displace material from the heated body portion into the aperture against the member locating the member in the selected position in the aperture, and means for cooling the heated body portion to secure the member in the selected position in the body of thermoplastic material.

13. Apparatus for making an electrical device having an electrically conductive member secured in a selected position in a body of thermoplastic material to have a portion of the member extending from the body comprising means for supporting a body of rigid thermoplastic material having an aperture in the body and having an electrically conductive member disposed in a selected position in the aperture with selected clearance relative to the body in the aperture with a portion of the member extending from the aperture, means for applying a heated tool to a portion of the body adjacent the aperture for a selected period of time to heat a selected limited portion of the body material abutting the aperture to a selected temperature equal to a glass transition temperature of the material and less than a melting temperature of the material, means for thereafter pressing the tool against the heated body material portion with a selected force to displace body material from the heated body portion into the aperture against the member for locating the member in the selected position in the aperture, and means for cooling the heated body material portion to make the displaced body material rigid to secure the member in the selected position in the body of thermoplastic material.

14. Apparatus according to claim 13 wherein the heated tool comprises a heated hollow cylindrical tool portion, the means applying the tool apply an end of the heated hollow cylindrical portion of the tool to the part of the body surrounding the aperture at a surface of the body to heat the selected limited portion of the body material to the selected temperature with the hollow cylindrical portion of the tool accommodating the extending portion of the member therein, and means pressing the tool thereafter presses the tool axially relative to the hollow cylindrical portion thereof to penetrate the heated portion of the body material surrounding the aperture with said end of the hollow cylindrical tool portion to displace body material from the heated body portion into the aperture entirely around the member for sealing the member in the aperture, and means withdraw the tool with the heated hollow cylindrical tool portion from the heated body portion to cool the body portion and make the displaced body material rigid.

15. Apparatus according to claim 14 wherein the means for applying the heated tool advance the heated tool in a selected direction into a position of engagement with said part of the body and retain the heated tool in said engagement for the selected period of time to heat the selected limited portion of the body material to the selected temperature, the means for pressing the tool against the body part again advance the heated tool in the selected direction to penetrate the portion of the body material heated to the selected temperature to displace said body material into the aperture, and the means for cooling withdraw the heated tool in an opposite direction from penetration and engagement with the body for permitting the displaced body material to cool and become rigid.

16. Apparatus for making an electrical connector device according to claim 15 wherein the body has a plurality of the apertures having a plurality of the members comprising connector contacts disposed in selected positions in the respective apertures with selected clearance relative to the body in the apertures and having terminal portions of the contact members extending from respective apertures in selected spaced side-by-side parallel relation to each other, the heated tool has a plurality of the heated hollow cylindrical portions arranged in said selected spaced side-by-side parallel relation to each other with said end of each cylindrical portion disposed in a common plane to be applied to parts of the body surrounding the respective apertures at a surface of the body to heat selected limited portions of the body material to the selected temperature around the respective apertures abutting the respective apertures with the hollow cylindrical portions of the tool accommodating respective terminal portions of the contacts therein, and the means pressing the tool press each of the hollow cylindrical portions with the selected force to penetrate respective heated portions of the body material with respective ends of the hollow cylindrical portions to displace body material from the heated body portions into the respective apertures.

17. Apparatus according to claim 16 wherein said ends of the heated hollow cylindrical portions of the tool have a selected outer diameter to permit selected body material to remain on said body surface free of penetration by the cylindrical tool portions between adjacent apertures.

18. Apparatus according to claim 17 wherein the hollow cylindrical portions of the heated tool have opposite ends of square cross-sectional configuration fitted together in a cluster having flat surfaces thereof fitted in abutting relation to adjacent portions in the cluster, and means are carried on the tool adjacent said opposite ends for applying heat to the hollow cylindrical tool portions through the opposite ends thereof.

19. Apparatus according to claim 16 wherein the supporting means has stop means arranged to limit advancement of the tool to limit penetration of the body by the tool.

20. Apparatus according to claim 13 wherein the heated tool has two heated portions to be applied to two parts of the body on a surface of the body adjacent respective opposite sides of the aperture to heat respective selected limited portions of the body material to the selected temperature at locations abutting the respective opposite sides of the aperture, and the means pressing the tool press the two heated portions of the tool against the two parts of the body at the same time to displace body material from the respective heated body portions into respective opposite sides of the aperture against respective opposite sides of the member at the same time to locate the member in the aperture.

21. An electrical connector device comprising a molded body of thermoplastic material having a plurality of molded-in apertures of selected length therein arranged in selected spaced side-by-side relation to each other and having a plurality of metal contact members secured in corresponding spaced side-by-side relation to each other in the respective apertures with terminal portions of the members extending from the apertures, portions of the body material defining limited portions of the length of the respective molded-in apertures being disposed around portions of the respective members positioning the members in said corresponding spaced relation and a plurality of other limited portions of the body material being cooled in situ bearing against circumferences of the respective members securing the members in the respective apertures in said corresponding spaced relation and sealing the apertures with the remainder of the body being in substantially stress-free as-molded condition.

22. An electrical connector according to claim 21 wherein the members have reentrant surface portions thereof disposed in the respective apertures, and the selected portions of the body material cooled in situ against the members are disposed in the reentrant surface portions of the respective member locking the members in the body.

23. An electrical connector according to claim 22 wherein each member has a plurality of reentrant surface portions extending around the member disposed in its respective aperture and the selected portions of the body material cooled in situ against the respective members are disposed within the plural reentrant surface portions of the members.

24. An electrical connector device according to claim 23 wherein the members have longitudinal axes aligned with the respective apertures and the reentrant surface portions of the members have flat surfaces thereon disposed perpendicular to the respective axes facing away from the extending portions of the members to prevent dislodgement of the members in response to forces axially applied to the extending member portions toward the connector body.

25. An electrical connector device according to claim 21 wherein two selected portions of the body material are cooled in situ against respective opposite sides of the member in the aperture.

* * * * *